(12) United States Patent
Scagliarini

(10) Patent No.: US 10,687,431 B2
(45) Date of Patent: Jun. 16, 2020

(54) ELEMENT FOR IMPROVED VENTILATION OF A HOUSING CONTAINING AN ELECTRICAL, ELECTRONIC, MECHANICAL OR SIMILAR DEVICE

(71) Applicant: GVS S.P.A., Zola Predosa (BO) (IT)

(72) Inventor: Marco Scagliarini, Bologna (IT)

(73) Assignee: GVS S.P.A., Zola Predosa (BO) (IT)

(*) Notice: Subject to any disclaimer, the term of this patent is extended or adjusted under 35 U.S.C. 154(b) by 268 days.

(21) Appl. No.: 15/551,074

(22) PCT Filed: Feb. 15, 2016

(86) PCT No.: PCT/IB2016/050787
§ 371 (c)(1),
(2) Date: Aug. 15, 2017

(87) PCT Pub. No.: WO2016/132269
PCT Pub. Date: Aug. 25, 2016

(65) Prior Publication Data
US 2018/0035558 A1 Feb. 1, 2018

(30) Foreign Application Priority Data
Feb. 18, 2015 (IT) .............. MI2015A0227

(51) Int. Cl.
*H05K 5/02* (2006.01)
*F21S 45/33* (2018.01)
*F21S 45/10* (2018.01)

(52) U.S. Cl.
CPC ............ *H05K 5/0213* (2013.01); *F21S 45/10* (2018.01); *F21S 45/33* (2018.01)

(58) Field of Classification Search
CPC ........ H05K 5/0213; F21S 45/10; F21S 45/20; F21S 45/30; F21S 45/33; F21S 45/40
(Continued)

(56) References Cited

U.S. PATENT DOCUMENTS 8,292,109 B2 * 10/2012 Lauk .................... F16H 57/027
215/307
9,303,839 B2 * 4/2016 Scagliarini .............. F21V 31/03
2009/0266815 A1 10/2009 Lauk et al.

FOREIGN PATENT DOCUMENTS

DE 9115939 U1 2/1992
DE 102006062044 A1 4/2008
(Continued)

OTHER PUBLICATIONS

International Search Report and Written Opinion dated Jun. 6, 2016 for PCT/IB2016/050338 to GVS S.P.A. filed Feb. 15, 2016.

*Primary Examiner* — Edelmira Bosques
*Assistant Examiner* — Dana K Tighe
(74) *Attorney, Agent, or Firm* — Dickinson Wright PLLC

(57) ABSTRACT

An element for ventilation of a housing containing an electrical, electronic, mechanical, electromechanical or similar device such as a motor vehicle headlamp, including a rigid body having an outer cylindrical wall, closed off at a first extremity by a closing part, the cylindrical wall open at a second extremity attached to the housing, the body including an inner member of an at least partly yielding material having a first extremity close to the closing part of the rigid body and bearing a filtering membrane, and a second open extremity facing the housing; between the filtering membrane or the first extremity of the inner member and the closing part of the rigid body there is a distance of between 1 and 4 mm, securer for securing insertion of the inner member within the rigid body provided to allow the distance to be automatically maintained at time of insertion.

16 Claims, 3 Drawing Sheets

(58) Field of Classification Search
USPC .......................................... 454/184, 333, 284
See application file for complete search history.

(56) References Cited

FOREIGN PATENT DOCUMENTS

| | | |
|---|---|---|
| EP | 1102002 A2 | 5/2001 |
| EP | 1903843 A2 | 3/2008 |
| EP | 1939523 A1 | 7/2008 |
| JP | 2015032476 A | 2/2015 |
| WO | 2013156887 A1 | 10/2013 |

* cited by examiner

ELEMENT FOR IMPROVED VENTILATION OF A HOUSING CONTAINING AN ELECTRICAL, ELECTRONIC, MECHANICAL OR SIMILAR DEVICE

CROSS-REFERENCE TO RELATED APPLICATIONS

This is a § 371 National Stage Application of International Application No. PCT/IB2016/050787 filed on Feb. 15, 2016, claiming the priority of Italian Patent Application No. MI2015A000227 filed on Feb. 18, 2015.

This invention relates to an element for the ventilation of a housing containing an electrical, mechanical, electronic, electromechanical or similar device in accordance with the pre-characterising clause of the principal claim. Such a ventilation element is described in WO2013/156887.

As is known, elements for the ventilation of housing containing electrical or electronic parts (such as optical units or headlamps in motor vehicles) or mechanical parts (gearboxes, hydraulic transmission systems, window operating systems or wiper units, for example) are widely used in the motor industry or in vehicles in general. In such housings there is a need to equalise the pressure between the space inside the containers and the outside environment.

It is also known that these ventilation elements are constructed so as to limit the ingress of water within said containers or housings, said water deriving from rain or puddles or washing of the vehicle or its engine. For example, a ventilation element comprising a cylindrical covering member that is closed off at one end and open at the other, into which a substantially cylindrical body is inserted, is known from EP1102002. A passage for air is formed between the inner wall of aforesaid member and the outer wall of the inner body, and between the lower surface of the member and the lower extremity of that body. A plurality of projections are located along the periphery of the inner body, at predetermined intervals; when aforesaid body is not attached to the covering member, its outside diameter (including the projections) is greater than that of the member itself, while when the body is inserted into the member its projections come into contact with the inner wall of aforesaid unit in such a way that the body is positioned and secured within it and a passage for air is created between the projections.

A hydrophobic membrane may be associated with the inner body at one end of the latter within said covering member.

WO2013156887 in the name of the applicant describes an element for the ventilation of a housing of the type mentioned; said element comprises a rigid body having an outer cylindrical wall, which is closed off at a first extremity by a closing member, said cylindrical wall being open at a second extremity that is connected to the housing. This body contains an inner unit of material which is at least partly yielding and has a first extremity close to the part enclosing the rigid body and bears a filtering membrane; the second extremity of said member is open and faces the housing. An internal cylindrical portion containing that member and connected to it through an interference fit so as to hold it within the body is separated from the closed part.

Within the cylindrical portion slots are present close to the closing member. In front of these there are shoulders which, as described, prevent any drops of water which might enter the ventilation element from impacting with the membrane, damaging it, or in any way interfering with its ventilation function.

This solution represents an optimum element for the ventilation of a housing such as that described above.

However in some function tests to which such a ventilation element has been subjected before marketing, or after an attachment mounting such element on the headlamp housing has been used in extreme conditions, it has been found that water may pool within the rigid body, between the membrane and the closing part. This happens even though there are shoulders in front of the slots mentioned above.

This pooling, which is due to a capillarity effect (or similar physical effect) causes deterioration of the ventilating characteristics of the abovementioned element, with obvious repercussions on the effectiveness of the ventilation of the housing to which it is attached.

This problem has not been mentioned or suggested and has therefore never been tackled by known solutions and by the patent texts mentioned above, but may be of significance when the abovementioned element is in use.

DE102006062044 relates to a pressure compensation device for compensating pressure between an inner chamber of a housing, in particular an electric motor, gearbox, container or the like and an outer side. The device includes a pressure compensation membrane mounted on an annular end face of a cylindrical structure that extends towards the outer side. The cylindrical structure is provided with a ventilation channel and extends towards the outer side in order to form a projection from the wall of the housing, which projection is delimited by the end face on which the membrane is applied in a curved, dome-shaped form. A protective cover extends towards the outer side at a spaced apart distance in relation to the membrane over the cylindrical structure.

This patent text describes that the protective cover extends over the membrane over a distance such as to prevent the build-up of water on the membrane itself through a capillary effect. In particular, the curved dome shape has the effect of preventing the build-up of water on the membrane. Also, the cover has a disc-shaped structure (which overlaps the membrane) and a number of ribs which project from that structure and bear against a wall of the element of the housing which has to be compensated. Openings which are placed laterally with respect to said membrane and the structure supporting it are therefore provided between the ribs.

The known solution does not describe a ventilation element with a rigid body housing an internal member of yielding material, bearing the filtering membrane with a continuous free surface, in that in the prior art the surface of the filtering membrane is partly occluded by the supporting structure. This limits its operational performance.

In addition to this the known solution makes use of the dome shape of the filtering membrane (and the relative structure supporting it) and the openings present at the sides thereof, to prevent the build-up of water between the protective cover and the membrane. However, specifically because of the abovementioned openings in the protective cover, water can penetrate the pressure compensating element and directly strike the filtering membrane, something which over time might limit the functionality of the membrane. Thus in the prior text considered there is inadequate protection for the membrane against agents from outside the compensating element.

JP2015032476(A) describes a structure suitable for preventing fogging within a lamp chamber by generating ventilation characteristics on the inside and outside of the lamp chamber formed of a lamp housing and a lens in a lamp structure, and preventing or inhibiting intrusion of insects into the lamp chamber. According to this prior document, a breathing hole structure forms an air passage that provides communication between the inside of a lamp chamber and the outside when the lamp chamber is formed of a lamp housing and a lens. The inside of the air passage is provided with a filter member made of a material containing at least one insect repellent chemical agent and an insecticide.

This document does not describe the use of a filtering membrane, but describes the use of a structure perforated with a plurality of holes. However water originating from outside the structure can pass through these holes. Thus the solution in this prior art cannot be properly used to prevent water from entering the holes.

Also the document considered describes a structure which has structural characteristics differing from those of the ventilation element in this invention.

EP1939523 describes a ventilation member including a tubular part, a gas permeable filter, and a cover part. In an attached state where the tubular part is fitted into the cover part, gaps functioning as gas passages are formed between a bottom portion of the cover part and the gas permeable filter and between a side wall portion of the cover part and a body portion of the tubular part. The opening area of a filter-end opening with respect to an in-plane direction perpendicular to the thickness direction of the gas permeable filter is larger than the opening area of a connection-end opening with respect to the in-plane direction.

This ventilation unit has a different structure from that to which this invention relates and in particular does not have a rigid internal cylindrical portion with which a tubular unit of at least partly yielding material is associated. In addition to this, the air circulates through a rigid outer body and an inner body of yielding material (or vice versa), which has the consequence that it is not possible to ensure that the distance between these elements making up the known ventilation unit will maintain a predetermined relative spacing. It follows that it is impossible to be certain that an adequate distance can be maintained between the filtering membrane and the part of the ventilation unit overlying it. Thus it is not possible to ensure prevention of a capillary effect drawing water into the space or chamber between the membrane and said part overlying it, or the creation of a ready flow towards the exterior for any water which might enter the ventilation unit.

In an embodiment described in the text in question it is also described that the inner portion of the ventilation element projects by an amount h from the outer portion. When the abovementioned unit is attached to the housing for the element which has to be ventilated, a suitable distance is created between this housing and aforesaid outer portion which is sufficient to prevent drops of water from entering the ventilation unit and its ventilation channels (which, additionally, are provided directly in the inner portion).

In the light of the description cited above it is therefore unlikely that a person skilled in the art might think of creating and maintaining a suitable distance between the membrane and the part of the outer portion overlying it in order to prevent water from being drawn in and pooling between said membrane and that part. This is why this problem has been solved in another way by acting on the distance by which the outer portion of the ventilation unit projects beyond the inner.

EP1903843 describes electronic components such as a control unit for controlling operation of an internal combustion engine contained in a waterproof casing. The casing is composed of a base and a cover, both connected to each other in a watertight manner. A breathing filter for establishing air communication between an inside and an outside of the casing is mounted on a mounting surface formed on an outer surface of the cover. The mounting surface is elevated from the outer surface of the cover, and has a plane facing a flange of the breathing filter. The plane is small relative to a height of a breathing hole of the breathing filter. Since the plane on the mounting surface facing the flange of the breathing filter is small relative to the height of the breathing hole, the breathing hole is prevented from being blocked by water remaining on the mounting hole as a result of its surface tension.

In this case, water is prevented from remaining in the ventilation hole through a solution which involves the surface on which the housing associated with the ventilation element (ventilation filter) is mounted.

Nothing is said nor can be deduced with regard to the possibility of preventing the ingress and/or pooling of water within the ventilation element or in the ventilation hole of that element which relates to a particular construction of its inner components.

DE9115939 describes an electrical switching device, in particular for motor vehicles, having a housing which is closed off by a wall with which a ventilation device, having its own housing, is associated. The membrane in that device is protected by its own cover.

The object of this invention is to provide an element for the ventilation of a housing containing an electrical, mechanical, electromechanical or similar device, in particular in the motor vehicle field, which overcomes the abovementioned problem.

In particular, one object of the invention is to provide an element of the abovementioned type which is reliable in use and which is quick and simple to manufacture.

Another object of the invention is to provide an element of the type mentioned which can be assembled in a wholly automatic manner, while ensuring that the abovementioned problem is overcome.

This and other objects which will be clear to those skilled in the art will be achieved through a ventilation element according to the appended claims.

For a better understanding of this invention, the following drawings are provided purely by way of a non-limiting example, in which.

Figure 1:
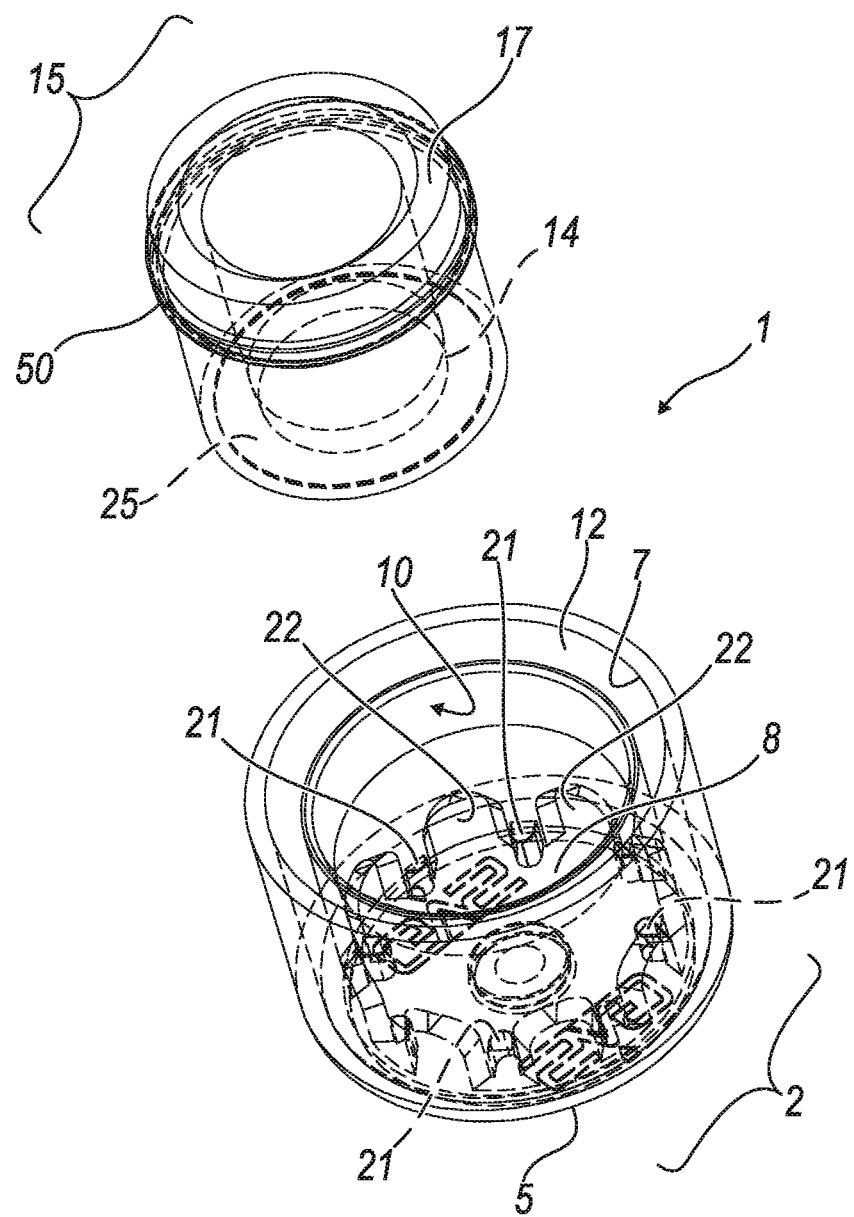
FIG. 1 is an exploded view of a first embodiment of a ventilation element according to the invention.
Figure 2:
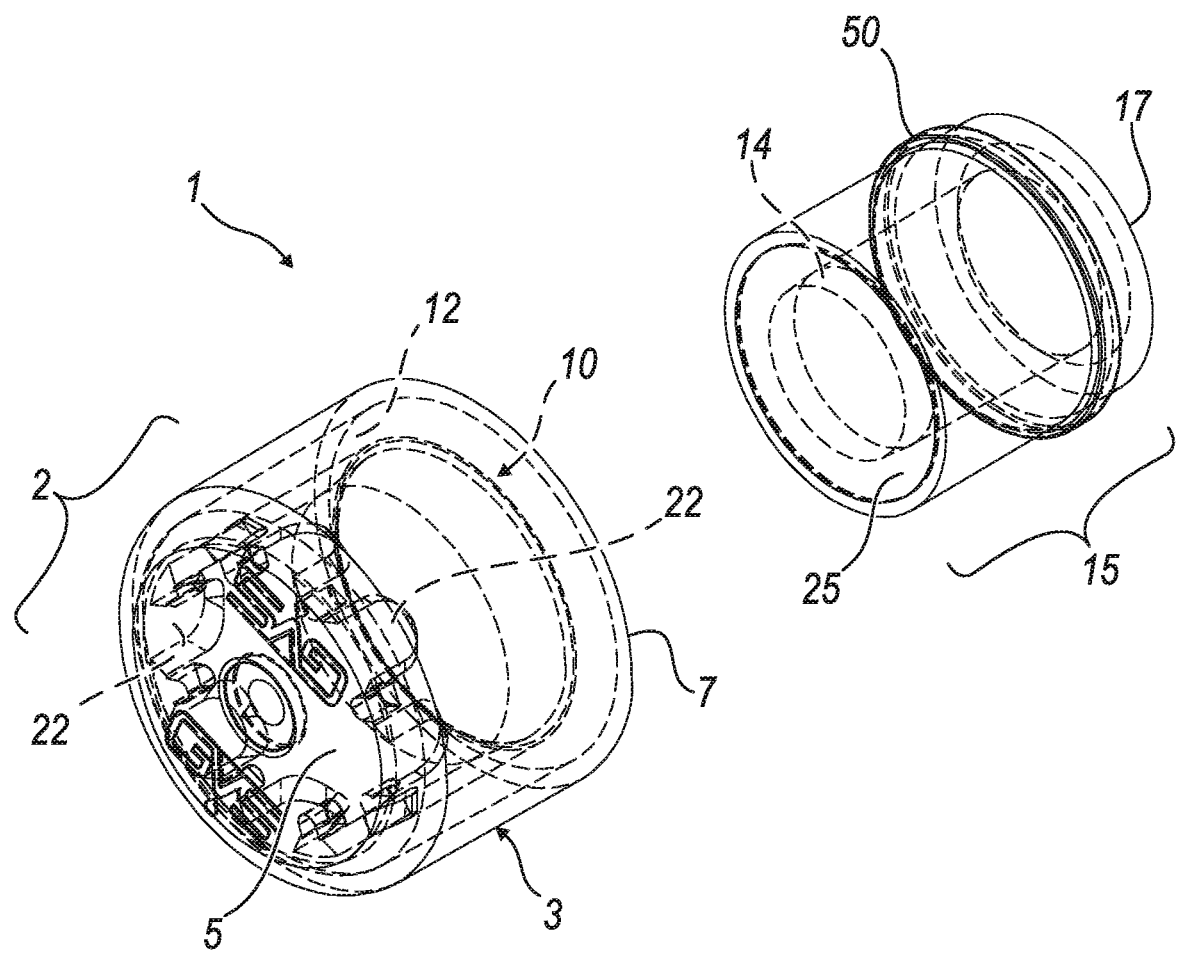
FIG. 2 shows an exploded view of the element in FIG. 1 from a different angle.
Figure 3:
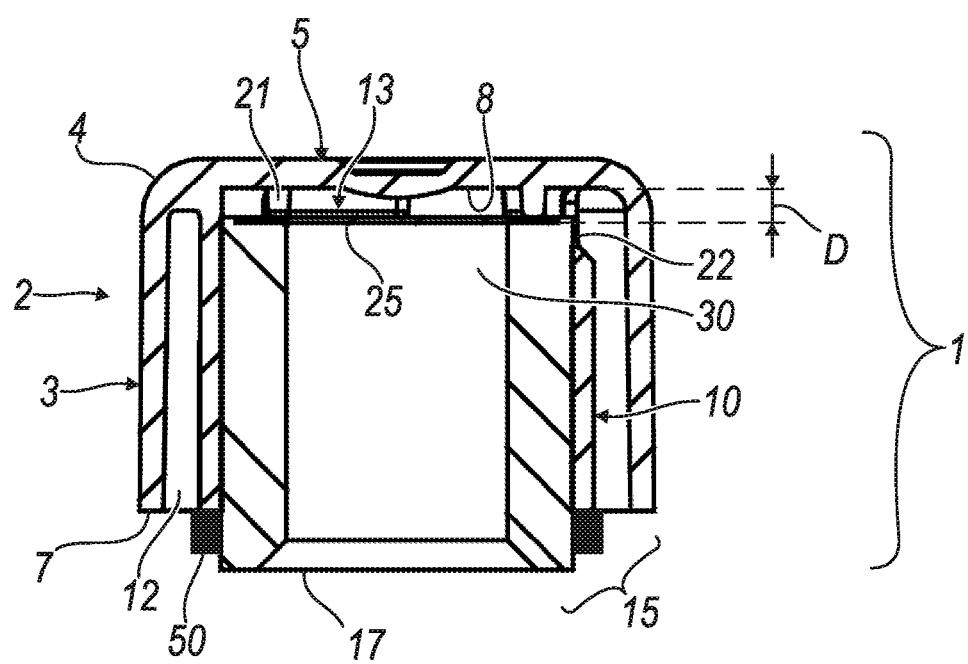
FIG. 3 shows a cross-section along the line 3-3 in FIG. 1, with the ventilation element assembled.

With reference to FIGS. 1-3, these show a ventilation element 1 for a housing containing an electrical, electronic, mechanical, electromechanical or similar device (not shown); this element 1 comprises a rigid body 2 made of plastics or sintered material and having a cylindrical part 3 which is closed off at a first extremity 4 by a substantially flat closing part 5 open at a second extremity 7 facing said housing. This part 5 preferably forms a single body with cylindrical part 3.

An inner cylindrical portion 10, which extends through its free extremity 10A as far as the second extremity 7 of body 2 and which is made of one piece with said part 5, projects from inner side 8 (with respect to body 2) of that part 5. This inner portion 10 is therefore a part of body 2.

As will be described, this space 12 in body 2 is in communication with a space or chamber 13 located between the first extremity 14 of a cylindrical member 15 coaxially inserted within inner cylindrical portion 10 of body 2 and held within the latter through an interference fit by that portion. This member 15 is of yielding material, such as natural or synthetic rubber or an equivalent material, and comprises a second extremity 17 which projects from body 2. This is of tubular shape and provides communication through a tube connection (defined by an inner conduit 30 in that body 15) within the housing and said membrane in such a way that air can pass from said housing through the membrane into space or chamber 13.

As a result of the fact that movable member 15 is of yielding material, it can be easily inserted and secured in body 2 (taking up any play and tolerances present between the member and said body) and can easily be attached to the housing which has to be ventilated. The yielding material also provides a seal at the point where it is attached to that housing.

First extremity 14 of device 15 is located to correspond to closing part 5 of body 2, but at a distance therefrom, so that abovementioned space or chamber 13 is thus formed between that part and said extremity. In order to ensure that abovementioned closing part 5 is positioned at a distance from member 15, shoulders 21 against which the first extremity 14 of member 15 bear, arise from inner side 8 of the latter. Shoulders 21 are in contact with member 15 within cylindrical portion 10 of body 2.

As mentioned, gap or intermediate space 12 communicates with space or chamber 13. This occurs through slots 22 provided in abovementioned portion 10, advantageously between two adjacent shoulders 21. Shoulders 21 are therefore not placed in front of the slots.

At first extremity 14, members 15 supports a membrane of hydrophobic material 25 which is in itself known (and which can be located outside such extremity 14 or incorporated within it) while element 1 is attached to the housing which has to be ventilated through second extremity 17 of that member. As mentioned, this coupling is made easier through the yielding material of said member 15.

Membrane 25 may be flat or of another shape, with a continuous surface or one having a succession of hills and valleys, for example, such as a concave surface (for example a tapering surface with its tip facing side 8) or may be convex. The membrane has a continuous free surface, that is one which is not occluded by any body which at least partly occupies it.

For the purposes of ventilation, the air of the housing to which element 1 is associated passes through conduit 30 of tubular member 15, passes through the entire surface of membrane 25 and from there into space 13. Through slots 22, air passes into intermediate space 12 and exits from body 2 through its second extremity 7. Thanks to the fact that gap or intermediate space 12 is defined by two rigid parts (wall 3 and portion 10), this cannot deform and ensures a constant flow of ventilating air. This flow is also freely able to pass through the slots as a result of the fact that shoulders 21 are placed on the sides of those slots (see for example FIG. 1) and not in front of them. These shoulders do not therefore obstruct the free passage of air through slots 22.

In addition to this, because the flow is always between rigid parts (wall 3 and portion 10), it can be calculated precisely and ensured through suitable design of rigid body 2.

The housing with which element 1 is associated may be exposed to moisture or be covered with water; such a situation is for example that in which said enclosure is the optical unit of a motor vehicle which is exposed to the weather when in use. Under these conditions a pool of water may form between membrane 25 and side 8 of closing part 5 because of the capillary effect (or similar effect) which draws drops of water into space 13, through intermediate space 12, from outside body 2.

In order to overcome this problem, while maintaining a simple structure for housing 1, it is provided that space or chamber 13 should have an appropriate volume such as to prevent aforesaid capillary effect as far as possible, and that securing means should be provided such as to position member 15 between portion 10 in such a way as to maintain that volume.

More particularly it is provided that chamber 13 should have a volume defined by a distance D between side 8 and membrane 25 or first extremity 14 of member 15, which is between 1 and 4 mm, advantageously between 1.5 and 2.5 mm. Aforesaid distance is such as to prevent (in the case of a distance D between 1.5 and 2.5 mm) or at least greatly limit (in the case of a distance greater than the latter range of dimensions) water or moisture from being drawn in from the outside of rigid body 2 through space 12, and such also as to prevent any drops of water which enter space or chamber 13 from remaining in it. This latter action is also assisted by the presence of slots 22 which are not intercepted or closed off at the front by shoulders 21. Slots 22 can aid water to escape because they are fully open, the water not coming into contact with anything during its movement exiting chamber 13 because the route is not occluded by shoulders 21, because the latter are at the sides of slots 22. In addition to this, any water present in space or chamber 13 is drawn back into space 12 through the (unobstructed) slots and therefore expelled.

In order to ensure that this distance is created between side 8 and membrane 25, there are provided spacing means or means securing the insertion of yielding cylindrical member 15 into rigid body 2 (or better portion 10 thereof). These securing means may be provided on the latter or on body 2 and in any event are such as to keep slots 22 unobstructed.

In a preferred embodiment shown in FIGS. 1-3, the yielding member comprises an outer collar 50 in the vicinity of its said second extremity 17 such as to bear against free extremity 10A of cylindrical portion 10 when that member is inserted within said portion 10. Collar 50 is located at a distance from said extremity 17 so that when member 15 is inserted within portion 10 membrane 25 is positioned at the desired distance from side 8 by closing part 5 keeping the passage through slots 22 free for the air and any water which has entered body 2. This is the case whether such insertion is made manually or automatically.

In addition to this, element 1, as described, is of lower cost than known solutions, as well as having shorter manufacturing times in comparison with the latter, thus resolving the problem mentioned above which such known solutions do not solve.

Various embodiments of the invention have been described. However yet others are possible in the light of the above description and should be regarded as falling within the scope of the following claims.

The invention claimed is:

1. A ventilation element for the ventilation of a housing containing an electrical, electronic, mechanical, or electromechanical device, said ventilation element comprising:
    a rigid body having an outer cylindrical wall closed off at a first extremity by a closing part, said outer cylindrical wall being open at a second extremity facing the housing,
    said rigid body comprising an inner cylindrical portion separated from said closing part of the rigid body and containing an inner tubular member of at least partly yielding material connected through an interference fit with said inner cylindrical portion so as to be held by the inner cylindrical portion within said rigid body, said inner cylindrical portion extending parallel to the outer cylindrical wall as far as the second extremity of the rigid body, there being present an intermediate space which is not deformable and able to provide a constant flow of ventilation air over time between the inner cylindrical portion and the outer cylindrical wall, said inner tubular member having a first extremity close to the closing part of the rigid body, said first extremity of said inner tubular member having a filtering membrane which has a continuous free surface, the inner tubular member having a second open extremity facing said housing, said inner tubular member having a hollow inner part forming a tubular connection between an inside of the housing and said membrane in such a way that the air can pass from said housing across the continuous free surface of the membrane, within a space formed between the first extremity of the inner tubular member and the closing part, said space being connected to said intermediate space through slots provided in said inner cylindrical portion close to said closing part, the air thus being able to pass from said space into said intermediate space and exit through the second open extremity of the outer cylindrical wall, wherein between the filtering membrane or the first extremity of said inner tubular member and the closing part of the rigid body there is a distance of between 1 and 4 mm, securing means securing insertion of said inner tubular member within the abovementioned rigid body being provided so as to allow said distance to be maintained at the time of said insertion, said securing means making it possible to keep the slots completely free and not obstructing passage of the air and exit of any water which might have penetrated within said rigid body and collected in the space, wherein said securing means include a collar affixed to said inner tubular member and provided externally to the inner tubular member, the collar sized and structured to abut against at least one part projecting internally within said rigid body.

2. The element according to claim 1, wherein said distance is between 1.5 and 2.5 mm.

3. The element according to claim 1, wherein the inner cylindrical portion is separate from said closing part of the rigid body and containing said inner tubular member, the inner tubular member being attached through the interference fit to said inner cylindrical portion to be held by the inner cylindrical portion within said rigid body, the collar able to bear against a free extremity of said inner cylindrical portion when said attachment is made.

4. The element according to claim 1, wherein the securing means include a plurality of shoulders projecting from said closed part toward said inner tubular member and capable of securing insertion of the inner tubular member into the rigid body in order to maintain the abovementioned distance.

5. The element according to claim 1, wherein said inner tubular member is made of natural or synthetic rubber or an equivalent yielding material.

6. The element according to claim 1, wherein said inner tubular member is made of natural or synthetic rubber.

7. The element according to claim 1, wherein the element is adapted and configured for the ventilation of the housing containing a headlamp of a motor vehicle.

8. The element according to claim 1, wherein the element is adapted and configured for the ventilation of the housing for electrical units or components.

9. The element according to claim 1, wherein the collar is sized and structured to abut against an axially facing surface of at least one part projecting internally within the rigid body.

10. A ventilation element for the ventilation of a housing containing an electrical, electronic, mechanical, or electro-mechanical device, said ventilation element comprising:

a rigid body having an outer cylindrical wall closed off at a first extremity by a closing part, said outer cylindrical wall being open at a second extremity facing the housing, the rigid body comprising an inner cylindrical portion separated from said closing part of the rigid body;

an inner tubular member of at least partly yielding material connected through an interference fit with the inner cylindrical portion so as to be held by the inner cylindrical portion within the rigid body;

the inner cylindrical portion extending parallel to the outer cylindrical wall up to the second extremity of the rigid body to define an intermediate space which is not deformable and able to provide a constant flow of ventilation air over time between the inner cylindrical portion and the outer cylindrical wall;

the inner tubular member having a first extremity close to the closing part of the rigid body, the first extremity of the inner tubular member having a filtering membrane which has a continuous free surface, the inner tubular member having a second open extremity facing the housing;

the inner tubular member having a hollow inner part forming a tubular connection between an inside of the housing and the membrane in such a way that the air can pass from said housing across the continuous free surface of the membrane, within a space formed between the first extremity of the inner tubular member and the closing part, said space being connected to the intermediate space through slots provided in the inner cylindrical portion close to the closing part, the air thus being able to pass from the space into the intermediate space and exit through the second open extremity of the outer cylindrical wall;

wherein between the filtering membrane or the first extremity of said inner tubular member and the closing part of the rigid body there is a distance of between 1 and 4 mm;

securing means securing insertion of said inner tubular member within the abovementioned rigid body being provided so as to allow the distance to be maintained at the time of the insertion, the securing means making it possible to keep the slots completely free and not completely free and not obstructing passage of the air and exit of any water which might have penetrated within said rigid body and collected in the space; wherein said securing means include a plurality of shoulders projecting from the closed part towards the inner tubular member and structured to maintain the abovementioned distance, the plurality of shoulders spaced circumferentially to the side of the slots provided in the inner cylindrical portion to keep the slots free and unobstructed.

11. The element according to claim 10, wherein said distance is between 1.5 and 2.5 mm.

12. The element according to claim 10, wherein said securing means include a collar affixed to said inner tubular member and provided externally to the inner tubular member, the collar sized and structured to abut against at least one part projecting internally within said body.

13. The element according to claim 12, wherein the inner cylindrical portion is separate from said closing part of the rigid body and containing said inner tubular member, the inner tubular member being attached through the interference fit to said inner cylindrical portion to be held by said inner cylindrical portion within said rigid body, the collar able to bear against a free extremity of said inner cylindrical portion when said attachment is made.

14. The element according to claim 10, wherein said inner tubular is made of natural or synthetic rubber or an equivalent yielding material.

15. The element according to claim 10, wherein the element is adapted and configured for the ventilation of the housing containing a headlamp of a motor vehicle.

16. The element according to claim 10, wherein the element is adapted and configured for the ventilation of the housing for electrical units or components.

* * * * *